United States Patent
Wu et al.

(10) Patent No.: US 11,009,571 B2
(45) Date of Patent: May 18, 2021

(54) MAGNETIC RESONANCE IMAGING APPARATUS AND A POWER SOURCE SUPPLY SYSTEM THEREFOR

(71) Applicant: Siemens Healthcare GmbH, Erlangen (DE)

(72) Inventors: Rui Ling Wu, Shenzhen (CN); Hai Bo Yu, Shenzhen (CN); Zhi Bin Li, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/395,958

(22) Filed: Apr. 26, 2019

(65) Prior Publication Data
US 2019/0331743 A1 Oct. 31, 2019

(30) Foreign Application Priority Data
Apr. 28, 2018 (CN) .......................... 201820636469.8

(51) Int. Cl.
G01V 3/00 (2006.01)
G01R 33/28 (2006.01)
H02M 7/04 (2006.01)

(52) U.S. Cl.
CPC .............. *G01R 33/28* (2013.01); *H02M 7/04* (2013.01)

(58) Field of Classification Search
CPC .............. G01R 33/5608; G01R 33/543; G01R 33/3815; G01R 33/3804; A61B 5/055
USPC ....................................................... 324/322
See application file for complete search history.

(56) References Cited

U.S. PATENT DOCUMENTS

| | | | | |
|---|---|---|---|---|
| 3,973,545 A | * | 8/1976 | Fischman | F02P 7/061 123/598 |
| 6,069,806 A | * | 5/2000 | Lenz | H02M 3/33561 363/67 |
| 2006/0114623 A1 | * | 6/2006 | Domoto | G01R 33/3852 361/18 |
| 2013/0181638 A1 | * | 7/2013 | Komatsu | A61B 6/0457 318/3 |
| 2014/0258772 A1 | * | 9/2014 | Kataria | H04B 3/46 714/4.11 |
| 2015/0137810 A1 | * | 5/2015 | Ham | G01R 33/38 324/309 |

OTHER PUBLICATIONS

What_Is_Switching_Frequency_Sunpower.pdf downloaded on May 7, 2020. Published 2019.*

* cited by examiner

*Primary Examiner* — Walter L Lindsay, Jr.
(74) *Attorney, Agent, or Firm* — Schiff Hardin LLP

(57) ABSTRACT

A power source supply system for a magnetic resonance imaging (MRI) apparatus that has multiple loads operating in a magnetic field environment, has an AC/DC conversion circuit that converts a supplied AC current to a first DC current having a predetermined first voltage, a branching element that supplies the first DC current in separate paths respectively to the multiple loads, a switching power source, disposed in each of the loads that converts the first DC current to a second DC current having a second voltage capable of being supplied to the load, with a switching frequency of the switching power source being set such that a positive integer frequency multiple thereof is offset from the Larmor frequency of the MRI apparatus.

6 Claims, 2 Drawing Sheets

MAGNETIC RESONANCE IMAGING APPARATUS AND A POWER SOURCE SUPPLY SYSTEM THEREFOR

BACKGROUND OF THE INVENTION

Field of the Invention

The present invention concerns a power source supply system for a magnetic resonance imaging (MRI) apparatus, as well as a magnetic resonance imaging apparatus, in particular a power source supply system capable of supplying electric power to a component operating in a magnetic field environment of the MRI apparatus.

Description of the Prior Art

In an existing magnetic resonance imaging (MRI) apparatus, an AC/DC conversion circuit must be used to convert 230 V AC current from a mains transformer to DC current, and to supply this to multiple loads of the MRI apparatus. Since the multiple loads require DC currents at different operating voltages, an independent power source supply is needed for each load, i.e. for the multiple loads, multiple AC/DC conversion elements must be provided in order to convert AC current from the mains transformer to DC power having different voltages, which can then be correspondingly supplied to the corresponding loads. In addition, a linear regulator must be provided for each converted DC power, in order to keep the DC power at a specified voltage, but the problem of heat dissipation from the linear regulator needs to be addressed.

SUMMARY OF THE INVENTION

In view of the above, an object of the present invention is to provide a power source supply system that provides a supply of electric power to multiple loads of an MRI system using a simple structure, and an MRI apparatus that includes such a power source supply system.

A power source supply system in accordance with the invention for a magnetic resonance imaging apparatus that has multiple loads operating in a magnetic field environment, has an AC/DC conversion circuit that converts a supplied AC current to a first DC current having a predetermined first voltage, and a branching element that supplies the first DC current in separate paths respectively to the multiple loads. The power supply system further has a switching power source, disposed in each of the loads that converts the first DC current to a second DC current having a second voltage capable of being supplied to the load. The switching frequency of the switching power source is set such that a positive integer frequency multiple thereof is offset from the Larmor frequency of the magnetic resonance imaging apparatus.

In the power source supply system described above, preferably, the switching frequency of the switching power source is selected from 2.2 MHz-2.6 MHz or a positive integer frequency multiple thereof.

In the power source supply system described above, preferably, the switching frequency of the switching power source is set to 2.5 MHz or a positive integer frequency multiple thereof.

In the power source supply system described above, preferably, the AC/DC conversion circuit has an AC/DC converter and a filter.

In the power source supply system described above, preferably, a transformer is used to convert AC power supplied from outside the system to AC power having a voltage capable of being supplied to the AC/DC conversion circuit.

In the power source supply system described above, preferably, the branching element is selected to be one of a Y-cable, or a power strip, or a PCBA.

A magnetic resonance imaging apparatus according to the invention has the power source supply system as described above.

According to the invention, the power source supply system provides a supply of electric power to multiple loads of an MRI system using a simple structure, and interference to magnetic resonance imaging is avoided by using the inventive power source supply system.

DESCRIPTION OF THE PREFERRED EMBODIMENTS

Figure 1:
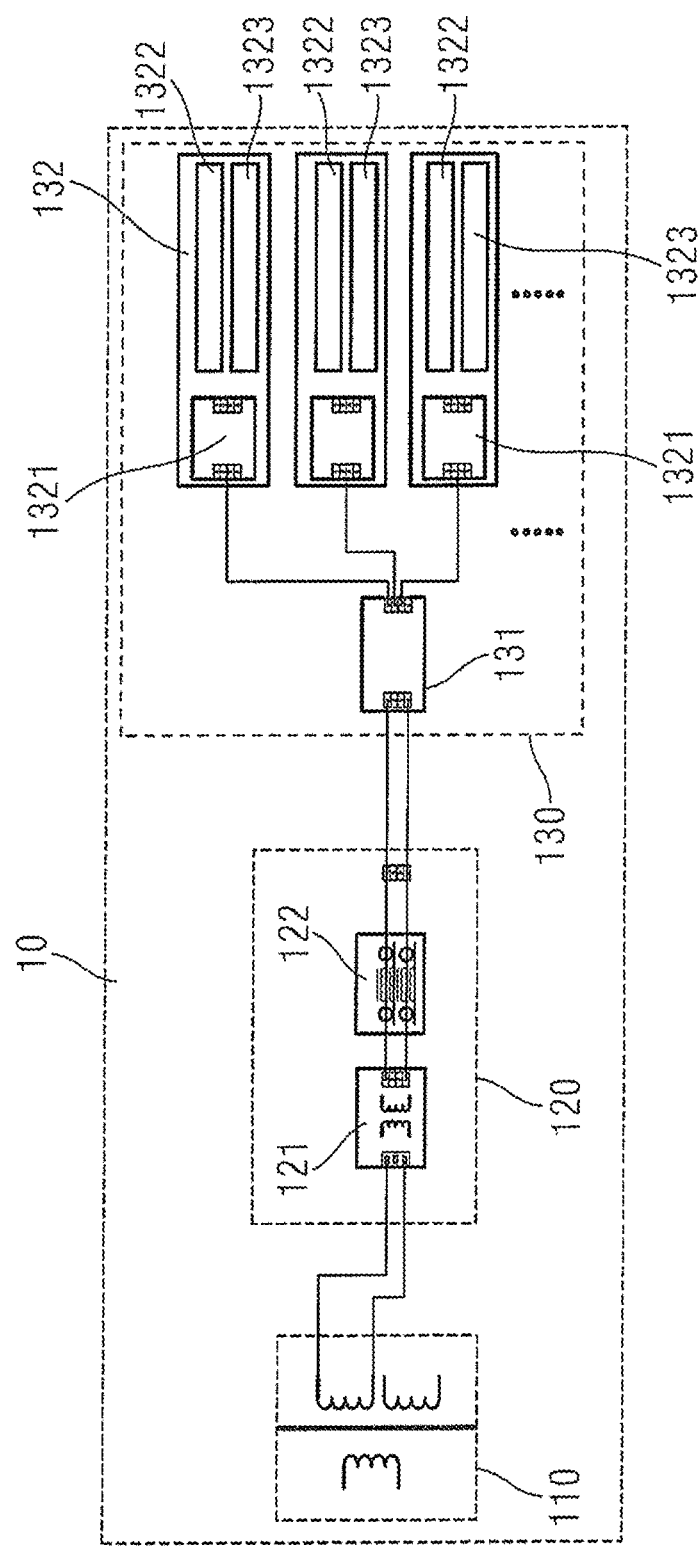
FIG. 1 is a block circuit diagram of the power source supply system for an MRI apparatus in accordance with the invention.

The present utility model is explained in detail below by embodiments.

As used herein, "schematic" means "serving as an instance, example or illustration". No drawing or embodiment described herein as "schematic" should be interpreted as a more preferred or more advantageous technical solution.

To make the drawings uncluttered, only those parts relevant to the present invention are shown schematically in the drawings; they do not represent the actual structure thereof as a product. Furthermore, to make the drawings appear uncluttered for ease of understanding, in the case of components having the same structure or function in certain drawings, only one of these is shown schematically, or only one is marked.

As used herein, "first" and "second" etc. are merely used to differentiate between parts, not to indicate their order or degree of importance, etc.

FIG. 1 is a block circuit diagram of a power source supply system 10 for an MRI apparatus. As FIG. 1 shows, the power source supply system 10 is used for supplying electric power to multiple loads 132, which operate in a magnetic field environment when the MRI apparatus is performing an examination.

In the power source supply system 10 in this embodiment, a transformer 110 is used to convert AC power supplied from outside the system to AC power having a voltage capable of being supplied to a filter plate 120 (AC/DC conversion part) mentioned below, for example 230 V AC power.

The following are provided at the filter plate 120: an AC/DC converter (AC/DC conversion element) 121, which converts the AC current to DC current and a filter 122, which filters a first DC current resulting from conversion, and thereby obtains a first DC current having a predetermined first voltage (e.g. 24 V). Here, the AC/DC conversion element 121 may use, for example, half-wave rectification or full-wave rectification. A filtering resistance in the filter 122 is for example an inductance. In this embodiment, the AC/DC converter 121 and the filter 122 together form the AC/DC conversion circuit.

The first DC current emitted as an output from the filter plate 120 is supplied to a branching element 131 in a part 130 of the MRI apparatus that is situated in an examination room. The branching element 131 supplies the first DC current in separate paths respectively to the multiple loads 132, which operate in a magnetic field environment generated by a magnet when the MRI apparatus is performing a magnetic resonance examination of an examination subject. In this embodiment, the branching element 131 is, for example, a Y-cable or a power strip or a PCBA (Printed Circuit Board Assembly). However, this is not a restriction with regard to the branching element 131, which could also be disposed on a part of the MRI apparatus that is inside a control room, instead of being disposed on the part of the MRI apparatus that is inside the examination room.

The load 132 is, for example, a system component that requires electric power to operate, such as an RF component or a patient bed. The load 132 includes a sub-element 1323, a control circuit 1322 that controls operation of the load 132, and a switching power source 1321, which converts the first DC current to a second DC current having a second voltage capable of being supplied to the load 132.

The switching power source 1321 is, for example, a boost converter, a buck converter or a buck-boost converter. The first DC current having the first voltage is converted to the second DC current having the specific second voltage by a certain switching frequency, the second voltage being matched to an operating voltage of the load 132.

However, in the structure described above, the MRI apparatus will generate a strong magnetic field when in an examination state, and the switching power source 1321 requires a certain switching action in the process of performing the conversion from the first DC current to the second DC current, and this switching action will affect the magnetic field of the MRI apparatus, causing non-homogeneity in the magnetic field, and in turn affecting the quality of magnetic resonance imaging. Detailed analysis and investigation of the problem have led to the invention insight that, by setting the switching frequency of the switching power source such that the Nth frequency multiple thereof is different from the Larmor frequency of the MRI apparatus, wherein N is an integer greater than or equal to 1, the problem of interference between the switching power source and the MRI system can be solved effectively.

For example, when the MRI apparatus is 1.5 Teslas, the Larmor frequency thereof is 63.75 MHz. In this embodiment, if the switching frequency of the switching power source 1321 is set to 2.5 MHz, then clearly the 25th frequency multiple thereof is 2.5 MHz×25=62.5 MHz, and the 26th frequency multiple thereof is 2.5 MHz×26=65 MHz. These are both offset from the Larmor frequency 63.75 MHz, and it can thereby be ensured that they will not interfere with the MRI apparatus.

Figure 2:
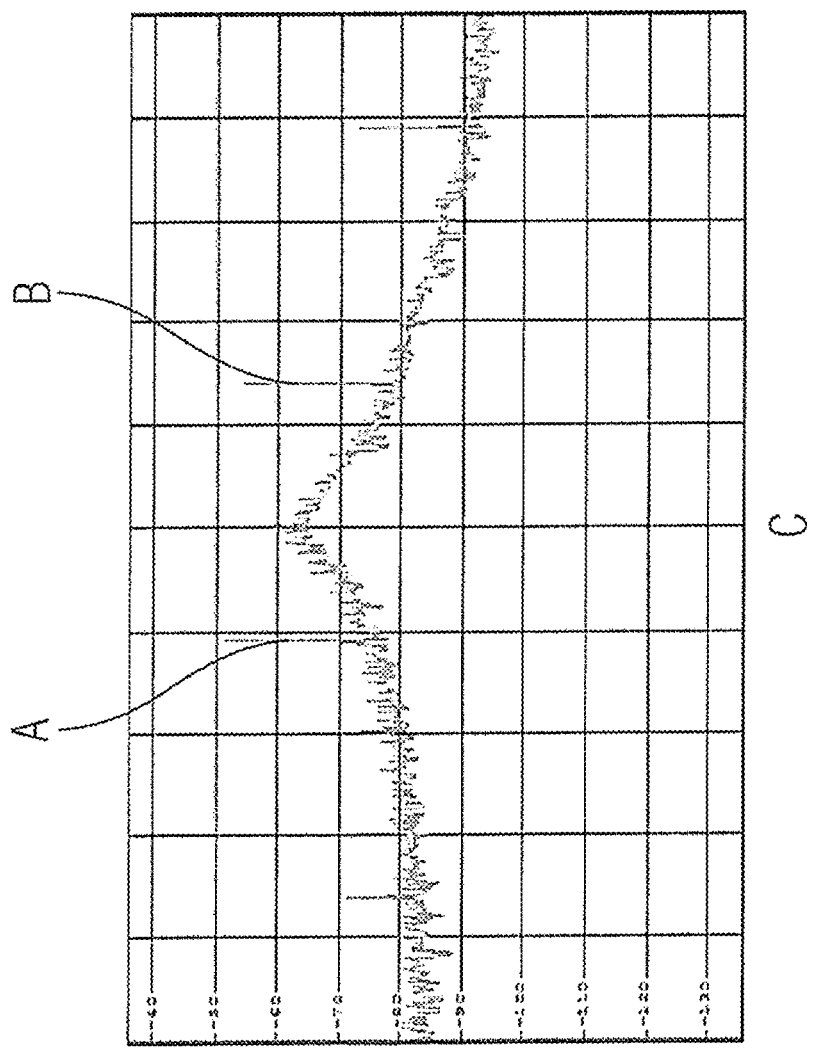
FIG. 2 shows test results when the switching power source having a specific switching frequency in this embodiment is employed.

FIG. 2 shows test results when the switching frequency of the switching power source 1321 is set to 2.5 MHz. It can be seen from FIG. 2 that the interferences A and B thereof occur at the 25th frequency multiple 62.5 MHz and the 26th frequency multiple 65 MHz, respectively, and no interference occurs at the center frequency C, i.e. the Larmor frequency 63.75 MHz of magnetic resonance device operation; hence, it is clear that the switching power source 1321 can operate normally.

Here, only the case where the switching frequency is set at 2.5 MHz is given as an example, but there is no restriction to this, as long as integer frequency multiples of the switching frequency can be offset from the Larmor frequency of the magnetic resonance system.

According to the present invention, the power source supply system provides a supply of electric power to multiple loads of an MRI system using a simple structure, and interference to magnetic resonance imaging are avoided by using the power source supply system.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A power source supply system for a magnetic resonance imaging apparatus that has multiple loads operating in a magnetic field environment, said power source supply system comprising:
   an AC/DC conversion circuit that converts a supplied AC current to a first DC current having a predetermined first voltage;
   a branching element that supplies the first DC current in separate paths respectively to the multiple loads;
   a switching power source, disposed in each of the loads, that converts the first DC current to a second DC current having a second voltage capable of being supplied to the load; and
   the switching power source having a switching frequency that is set such that a positive integer frequency multiple thereof is offset from the Larmor frequency of the magnetic resonance imaging apparatus, the switching frequency being selected from 2.2 MHz-2.6 MHz or a positive integer frequency multiple thereof.

2. A magnetic resonance imaging apparatus comprising:
   a magnetic resonance data acquisition scanner comprising multiple loads that operate in a magnetic field environment in order to acquire magnetic resonance data with said magnetic resonance data acquisition scanner operating at a Larmor frequency; and
   a power source supply system comprising an AC/DC conversion circuit that converts a supplied AC current to a first DC current having a predetermined first voltage, a branching element that supplies the first DC current in separate paths respectively to the multiple loads, a switching power source, disposed in each of the loads, that converts the first DC current to a second DC current having a second voltage capable of being supplied to the load, and the switching power source having a switching frequency that is set such that a positive integer frequency multiple thereof is offset from the magnetic resonance data acquisition scanner the switching frequency being selected from 2.2 MHz-2.6 MHz or a positive integer frequency multiple thereof.

3. The power source supply system as claimed in claim 1, wherein the switching frequency of the switching power source is 2.5 MHz or a positive integer frequency multiple thereof.

4. The power source supply system as claimed in claim 1, wherein the AC/DC conversion circuit comprises an AC/DC converter and a filter.

5. The power source supply system as claimed in claim 1, comprising a transformer that converts AC power supplied from outside power source supply the system to AC power having a voltage capable of being supplied to the AC/DC conversion circuit.

6. The power source supply system as claimed in claim 1, wherein the branching element is selected from the group consisting of a Y-cable, a power strip, and a PCBA.

* * * * *